(12) United States Patent
Tagami

(10) Patent No.: US 7,450,648 B2
(45) Date of Patent: *Nov. 11, 2008

(54) DIGITAL SIGNAL PROCESSING DEVICE, A METHOD AND A DELTA-SIGMA MODULATOR USING THE SAME METHOD

(75) Inventor: Shigeo Tagami, Tokyo (JP)

(73) Assignee: Sony Corporation (JP)

( * ) Notice: Subject to any disclaimer, the term of this patent is extended or adjusted under 35 U.S.C. 154(b) by 716 days.

This patent is subject to a terminal disclaimer.

(21) Appl. No.: 11/084,167

(22) Filed: Mar. 21, 2005

(65) Prior Publication Data

US 2005/0162887 A1    Jul. 28, 2005

Related U.S. Application Data

(63) Continuation of application No. 09/782,166, filed on Feb. 14, 2001, now Pat. No. 6,990,152.

(30) Foreign Application Priority Data

Feb. 18, 2000    (JP)    ............ P2000-046838

(51) Int. Cl.
    *H04B 14/06*    (2006.01)
(52) U.S. Cl. ............ 375/247; 375/340; 375/252; 341/143; 341/155
(58) Field of Classification Search .......... 375/247, 375/340, 244, 252; 341/143, 155
    See application file for complete search history.

(56) References Cited

U.S. PATENT DOCUMENTS

| 5,012,244 | A |  | 4/1991 | Wellard et al. |
| 5,075,679 | A |  | 12/1991 | Gazsi |
| 5,248,971 | A |  | 9/1993 | Mandl |
| 5,248,972 | A |  | 9/1993 | Karema et al. |
| 5,311,181 | A | * | 5/1994 | Ferguson et al. ............ 341/143 |
| 5,621,675 | A | * | 4/1997 | Linz et al. .................. 708/313 |
| 5,648,779 | A | * | 7/1997 | Cabler ........................ 341/143 |
| 5,742,246 | A |  | 4/1998 | Kuo et al. |
| 5,757,301 | A |  | 5/1998 | Kuo et al. |
| 5,805,093 | A | * | 9/1998 | Heikkila et al. ............ 341/143 |
| 6,075,820 | A |  | 6/2000 | Comino et al. |
| 6,600,789 | B1 | * | 7/2003 | Lipasti et al. ............... 375/247 |

FOREIGN PATENT DOCUMENTS

| EP | 0 512 687 A2 | 11/1992 |
| EP | 0 783 207 A2 | 7/1997 |

OTHER PUBLICATIONS

"AD/DA Converter and Digital Filter", Journal of Acoustical Society of Japan 46, No. 3 (1990).
EPO Search Report dated Aug. 21, 2003.

* cited by examiner

*Primary Examiner*—Phuong Phu
(74) *Attorney, Agent, or Firm*—Rader Fishman & Grauer PLLC; Ronald P. Kananen

(57) ABSTRACT

A signal processing device uses a ΔΣ modulator having varying effective orders to ensure an S/N ratio by selecting a high order when a 1-bit music signal is output via the ΔΣ modulator. The signal processing device prevents noise during switchover by shifting to a low order just before the ΔΣ modulator is bypassed if this occurs. The present invention provides a digital signal processing device which can switch between an original sound signal and a ΔΣ modulation signal and yield a sufficient S/N ratio for a reprocessed ΔΣ modulation signal. If any 1-bit original sound signal is input, little switching noise is generated.

8 Claims, 5 Drawing Sheets

DIGITAL SIGNAL PROCESSING DEVICE, A METHOD AND A DELTA-SIGMA MODULATOR USING THE SAME METHOD

This application is a Continuation Application of patent application Ser. No. 09/782,166, filed on Feb. 14, 2001 now U.S. Pat. No. 6,990,152, the entire contents incorporated by reference.

The present invention relates to a digital signal processing device, a method, and a $\Delta\Sigma$ modulator for applying edit processing, such as volume adjustment and the like, to digital audio data using high-speed 1-bit data.

A method called delta-sigma ($\Delta\Sigma$) modulation is proposed to digitize voice signals is described within Yamazaki, Yoshio, "AD/DA Converter and Digital Filter", Journal of the Acoustical Society of Japan 46, No. 3 (1990): pp. 251-257.

FIG. 1 is a block diagram of a $\Delta\Sigma$ modulation circuit for applying $\Delta\Sigma$ modulation to, e.g., 1-bit digital data. In FIG. 1, an input audio signal S is supplied from an input terminal 81 to an integrator 83 via an adder 82. This signal from the integrator 83 is supplied to a comparator 84. The signal is compared to a mid-point potential of, e.g., the input audio signal S and is quantized on a 1-bit basis every sampling period. A frequency for the sampling period (sampling frequency) is 64 or 128 times the conventional frequency 48 kHz or 44.1 kHz.

This quantized data is supplied to a 1-sample delay circuit 85 and is delayed for one sampling period. This delay data is converted to an analog signal in, e.g., a 1-bit D/A converter 86, is added to the adder 82, and is added to the input audio signal S from the input terminal 81.

The quantized data output from the comparator 84 is generated as 1-bit data D1 from an output terminal 87. According to $\Delta\Sigma$ modulation processing of this $\Delta\Sigma$ modulation circuit, as described in the above-mentioned document, it is possible to generate audio signals with a high dynamic range using a small number of bits, such as 1 bit, by sufficiently increasing the sampling frequency. It also is possible to provide a wide transmittable frequency band. The $\Delta\Sigma$ modulation circuit is suited for circuit configuration integration and can relatively easily provide A/D conversion accuracy. The $\Delta\Sigma$ modulation circuit is widely used in an A/D converter, for example. A simple analog low-pass filter can be used for restoring the $\Delta\Sigma$-modulated signal to an analog audio signal. By using these features, the $\Delta\Sigma$ modulation circuit can be applied to recorders and data transmission for handling high-quality data.

The above-mentioned $\Delta\Sigma$ modulation circuit thus generates 1-bit data for music data. In order to edit such music data using a high-speed 1-bit system, the following operation is needed, as disclosed in Japanese Patent Application Laid-Open Publication No. 9-307452 submitted by the applicant of the present invention. In the 1-bit data editing unit 90 shown in FIG. 2, 1-bit input data D11 is input as music data from an input terminal 91. In a multiplier 92, D11 is multiplied by a specified factor k to temporarily convert to multi-bit data Dm. This data is again $\Delta\Sigma$-modulated in a $\Delta\Sigma$ modulator 93 to be restored to 1-bit signal D1'. The $\Delta\Sigma$ modulator 93 is a multi-stage modulator in a plurality of orders using a plurality of integrators and has a more complicated configuration than for the $\Delta\Sigma$ modulation circuit in FIG. 1.

However, the above-mentioned configuration always lets signals pass the $\Delta\Sigma$ modulator 93. Even if no volume adjustment or the like is needed, namely, the factor k is 1.0, music data D11 always passes the $\Delta\Sigma$ modulator 93, degrading sound quality. A fraction eliminator 94 is used for performing specified addition and subtraction to eliminate a fraction remaining in an integrator inside the $\Delta\Sigma$ modulator 93. This operation approximates patterns for an original sound signal D1 and a $\Delta\Sigma$ modulation signal D1'. A delay circuit 96 is used to approximately align phases for the $\Delta\Sigma$ modulation signal D1' and the original sound signal D11. A control unit 97 monitors signal patterns for the $\Delta\Sigma$ modulation signal D1' and the original sound signal D11. When these patterns almost match, a selector 95 is switched to side a for the delayed original sound signal D1d from side b for the $\Delta\Sigma$ modulation signal D1'.

When no volume adjustment or the like is needed, this process can switch the $\Delta\Sigma$ modulation signal D1' over to the delayed original sound signal D11 and generate a 1-bit data output from an output terminal 95 without generating a switching noise or the like. This process also can bypass reprocessing in the $\Delta\Sigma$ modulator 93.

However, noise may be generated during this switching operation, depending on the specifications of the $\Delta\Sigma$ modulator 93 to be used and the frequency of the 1-bit data D11 to be input. Generally, a high-order $\Delta\Sigma$ modulator can provide a high S/N ratio in an audible band. On the other hand, frequency characteristics change at a point near the audible band. A phase can easily rotate at a high frequency. When high-order $\Delta\Sigma$ modulation is used and the input signal frequency is high, a level difference and a phase shift occurs between the delayed original sound signal D11 and the $\Delta\Sigma$ modulation signal D1'. Noise occurs when the selector 95 switches between these signals.

When the low-order $\Delta\Sigma$ modulator 93 is used, it hardly generates a noise during switchover because of little level difference and phase rotation. On the other hand, the audible band causes a low S/N ratio, lowering the S/N ratio when the $\Delta\Sigma$ modulator 93 is not bypassed.

BRIEF SUMMARY OF THE INVENTION

The present invention has been made in consideration of the foregoing. It is, therefore, an object of the present invention to provide a digital signal processing device having a simple configuration, a method, and a $\Delta\Sigma$ modulator for switching between an original sound signal and a $\Delta\Sigma$ modulation signal and providing a sufficient S/N ratio for a reprocessed $\Delta\Sigma$ modulation signal with little switching noise generated after input of any 1-bit original sound signal.

For solving the above-mentioned problems, a digital signal processing device according to the present invention comprises: multiplication means for multiplying an input $\Delta\Sigma$ modulation signal generated from $\Delta\Sigma$ modulation by a factor; $\Delta\Sigma$ modulation means having a plurality of integrators for varying effective orders and applying $\Delta\Sigma$ modulation again to an output from the multiplication means; and switchover means for switching between a reprocessed $\Delta\Sigma$ modulation signal from the $\Delta\Sigma$ modulation means and the input $\Delta\Sigma$ modulation signal.

This digital signal processing device uses a $\Delta\Sigma$ modulator with variable effective orders by changing orders for AL modulation signal output and the original sound signal.

For solving the above-mentioned problems, a digital signal processing method according to the present invention comprises: a multiplication step for multiplying an input $\Delta\Sigma$ modulation signal generated from $\Delta\Sigma$ modulation by a specified factor for specified processing; a reprocessed $\Delta\Sigma$ modulation step for reapplying $\Delta\Sigma$ modulation to an output provided with said specified processing by using a $\Delta\Sigma$ modulator comprising a plurality of integrators for varying effective orders; and a switchover step for switching between said input ΔΣ modulation signal and said reprocessed ΔΣ modulation signal.

For solving the above-mentioned problems, a ΔΣ modulator according to the present invention for applying ΔΣ modulation to a multi-bit signal comprises: a plurality of integrators; and order variation means for varying effective orders increasing due to connection with a plurality of said integrators.

DETAILED DESCRIPTION OF THE INVENTION

Figure 1:
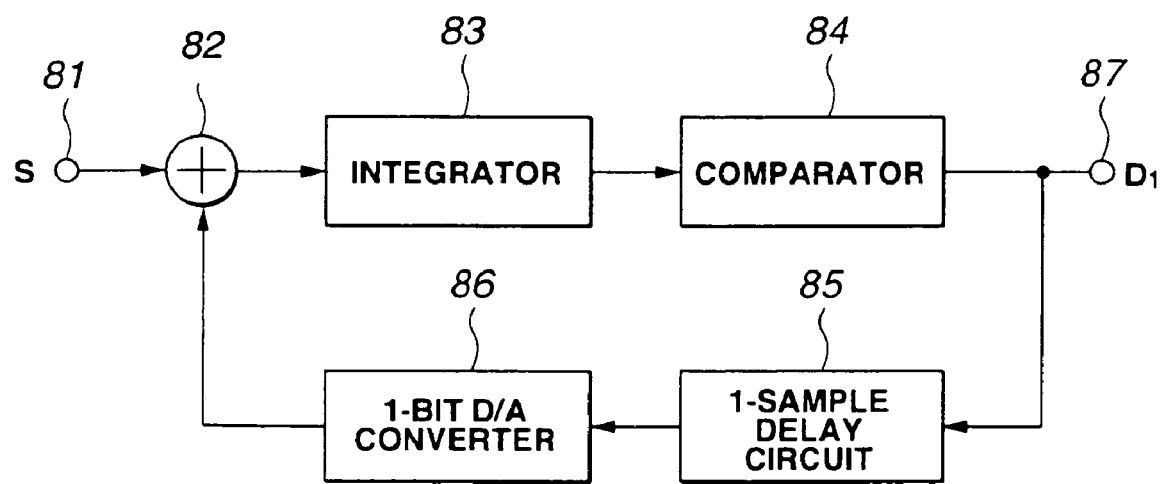
FIG. 1 is a basic configuration diagram of a ΔΣ modulator for generating.
Figure 2:
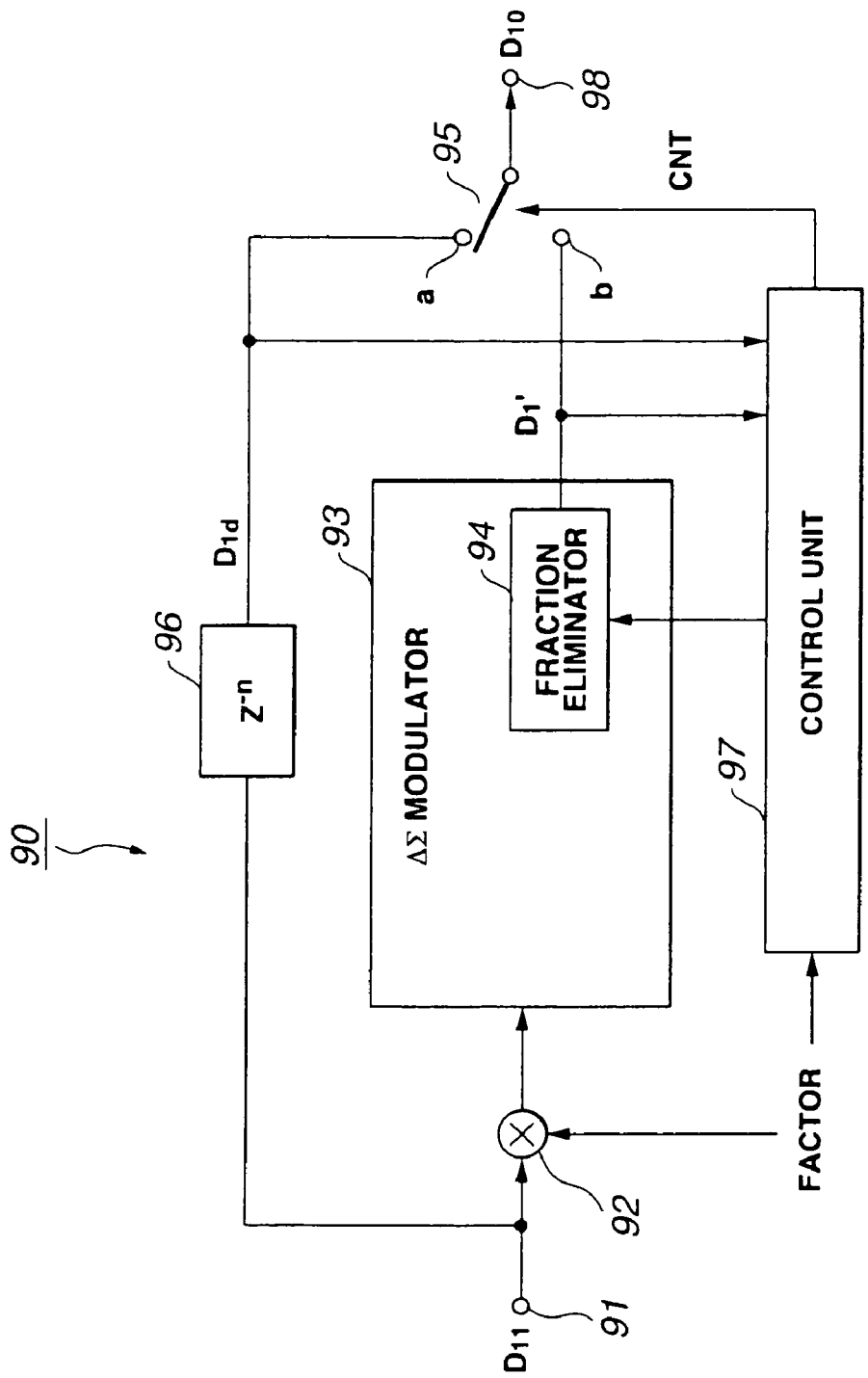
FIG. 2 is a block diagram showing a configuration of a conventional 1-bit data editing unit.
Figure 3:
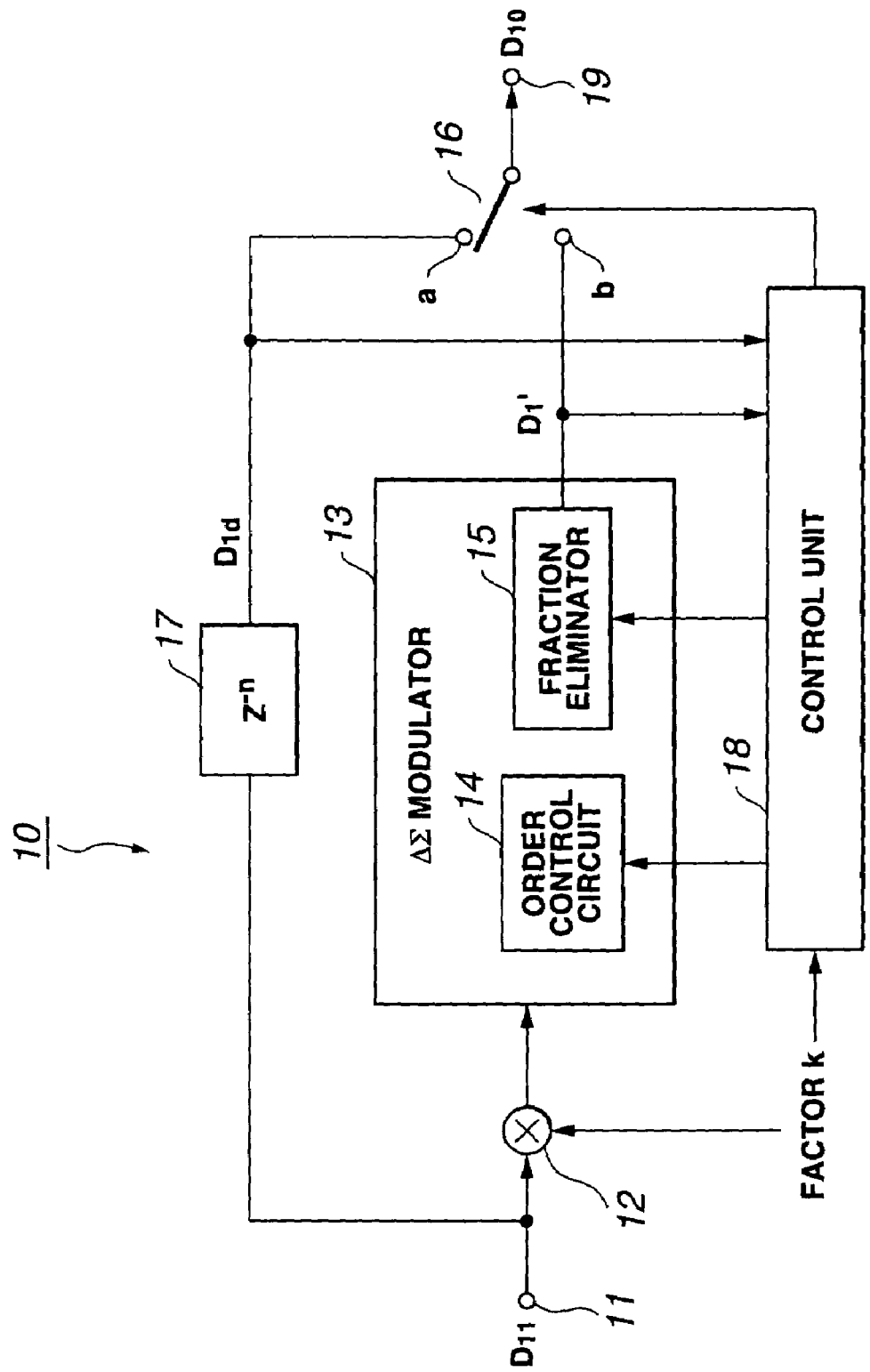
FIG. 3 is a block diagram showing a configuration of a 1-bit data editing unit according to an embodiment of the present invention.

Embodiments of the present invention will be described in farther detail with reference to the accompanying drawings. As shown in FIG. 3, this embodiment is a 1-bit data editing unit 10 which applies edit processing including fading such as fade-in and fade-out to music data D11 comprising 1-bit data resulting from ΔΣ modulation.

The 1-bit data editing unit 10 comprises a multiplier 12, a ΔΣ modulator 13, a delay circuit 17, a selector 16, and a control unit 18. The multiplier 12 multiplies input 1-bit data D11 by a factor k. The input 1-bit data D11 is the above-mentioned music data to be input to an input terminal 11. The ΔΣ modulator 13 comprises, e.g., five integrators and reapplies ΔΣ modulation to a multiplied output from the multiplier 12 by varying effective orders, as will be described later. The delay circuit 17 aligns a phase for the input 1-bit data D11 to the reprocessed ΔΣ modulation signal D1' from the ΔΣ modulator 13. The selector 16 switches between the delayed original sound signal D1d output from the delay circuit 17 and the reprocessed ΔΣ modulation signal D11. The control unit 18 provides controls to vary the effective orders for the ΔΣ modulator 13.

Figure 4:
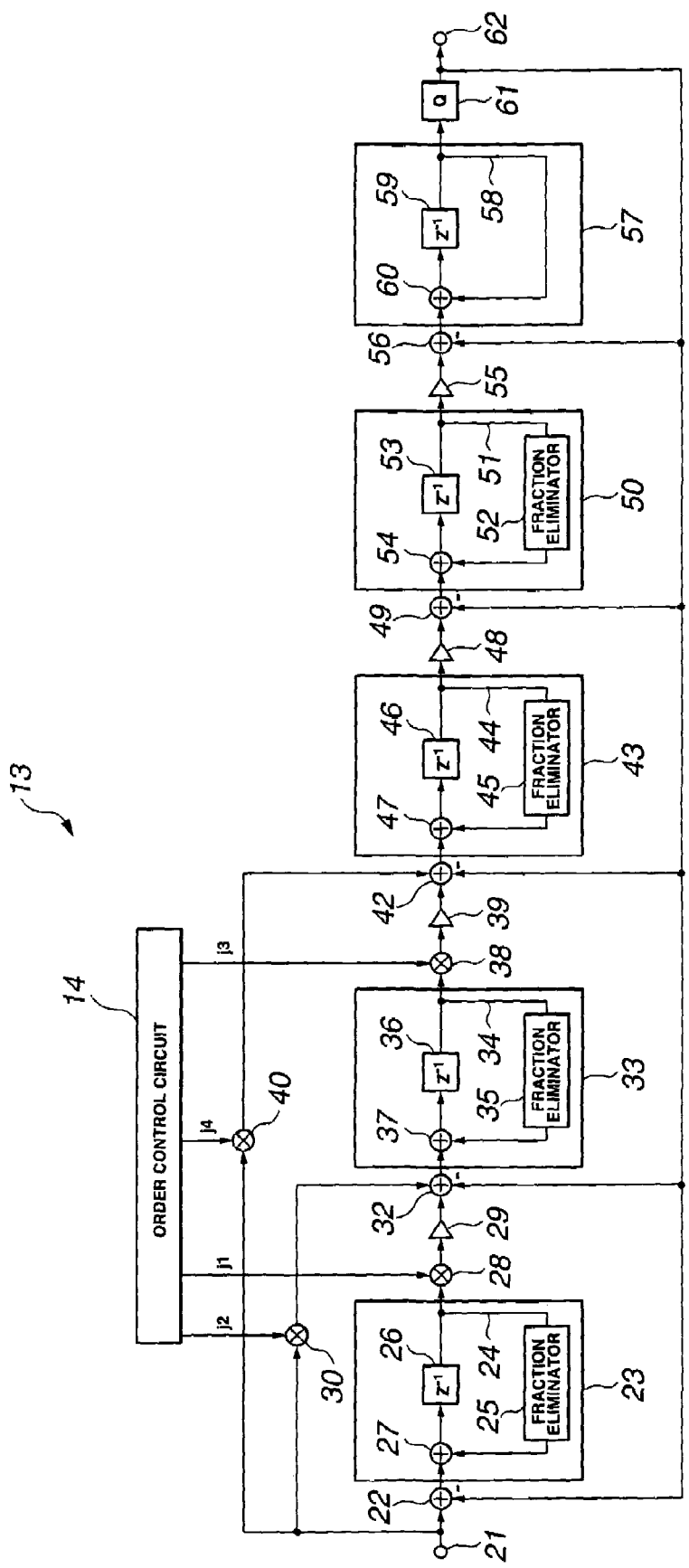
FIG. 4 shows a detailed configuration of a ΔΣ modulator constituting the above-mentioned 1-bit data editing unit.

As shown in FIG. 4, the ΔΣ modulator 13 is a 5-order (5-stage) ΔΣ modulator comprising five integrators 23, 33, 43, 50, and 57. As mentioned above, the ΔΣ modulator varies effective orders according to situations. This is to prevent noise for being generated during switchover between an original sound signal and a ΔΣ modulation signal depending on the specifications of the ΔΣ modulator to be used and the frequencies of input 1-bit data.

Figure 5:
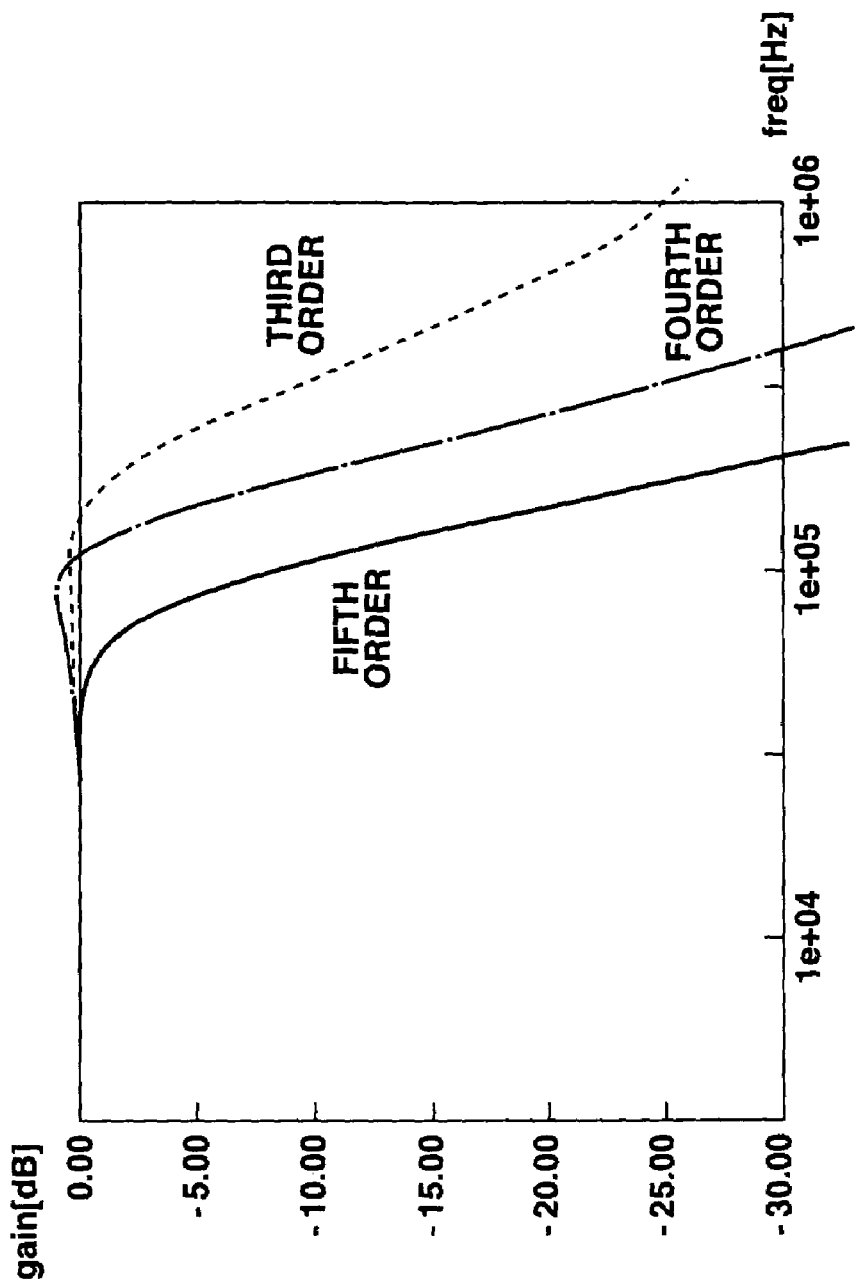
FIG. 5 is a frequency characteristics diagram of the above-mentioned ΔΣ modulator.

Generally, as shown in FIG. 5, the 3-, 4-, and 5-order ΔΣ modulators provide higher S/N ratios as their orders increase. On the other hand, the point at which frequency characteristics change nears the audible band, causing a phase to easily rotate at a high frequency. The ΔΣ modulator 13 switches the reprocessed ΔΣ modulation signal over to the delayed original sound signal when the order becomes low enough to cause small level differences and phase rotations at the high frequency.

The following describes the configuration of the ΔΣ modulator 13 in detail. The ΔΣ modulator 13 is configured as Z-1/(1-Z-1). In this configuration, the first integrator 23 uses a delay circuit 26 to delay an addition output from an adder 27. The integrator 23 supplies this output to a fraction eliminator 25 via a feedback loop 24, and then returns it to the adder 27 via the feedback loop 24.

The second integrator 33 also uses a delay circuit 36 to delay the addition output from an adder 37, supplies this output to a fraction eliminator 35 via a feedback loop 34, and then returns it to the adder 37 via the feedback loop 34.

Similarly, the third integrator 43 uses a delay circuit 46 to delay the addition output from an adder 47, supplies this output to a fraction eliminator 45 via a feedback loop 44, and then returns it to the adder 47 via the feedback loop 44.

Likewise, the fourth integrator 50 uses a delay circuit 53 to delay the addition output from an adder 54, supplies this output to a fraction eliminator 52 via a feedback loop 51, and then returns it to the adder 54 via the feedback loop 51.

The fifth integrator 57 has no fraction eliminator. The integrator 57 uses a delay circuit 59 to delay the addition output from an adder 60, and then returns it to the adder 60 via the feedback loop 58.

The ΔΣ modulator 13 comprises an adder 22, a multiplier 28, and a level adjuster 29. The adder 22 adds ΔΣ multiplication output from the multiplier 12 in FIG. 3 to quantized data fed back from a quantizer 61, to be described later. The quantized data has an inverted sign. The multiplier 28 multiplies the integral output from the first integrator 23 by the first order control factor j1 supplied from an order control circuit 14. The level adjuster 29 multiplies the multiplication output from the multiplier 28 by an appropriate gain.

The ΔΣ modulator 13 comprises a multiplier 30 and an adder 32. The multiplier 30 multiplies the multiplication output from the multiplier 12 by the second order control factor j2 supplied from the order control circuit 14. The adder 32 adds the multiplication output from the multiplier 30, the level adjustment output from the level adjuster 29, and quantized data with an inverted sign supplied from the quantizer 61 to generate an addition output. The adder 32 then supplies this addition output to the second integrator 33.

The ΔΣ modulator 13 comprises a multiplier 38 and a level adjuster 39. The multiplier 38 multiplies an integral output from the second integrator 33 by a third order control factor j3 supplied from the order control circuit 14. The level adjuster 39 multiplies a multiplication output from the multiplier 38 by an appropriate gain.

The ΔΣ modulator 13 comprises a multiplier 40 and an adder 42. The multiplier 40 multiplies a multiplication output from the multiplier 12 by a fourth order control factor j4 supplied from the order control circuit 14. The adder 42 adds the multiplication output from the multiplier 40, the level adjustment output from the level adjuster 39, and quantized data with an inverted sign supplied from the quantizer 61 to generate an addition output. The adder 42 then supplies this addition output to the third integrator 43.

The ΔΣ modulator 13 comprises a level adjuster 48 and an adder 49. The level adjuster 48 multiplies an integral output from the third integrator 43 by an appropriate gain. The adder 49 adds the level adjustment output from the level adjuster 48 to quantized data with an inverted sign supplied from the quantizer 61 to generate an addition output. The adder 49 then supplies this addition output to the fourth integrator 50.

The ΔΣ modulator 13 comprises a level adjuster 55 and an adder 56. The level adjuster 55 multiplies an integral output from the fourth integrator 50 by an appropriate gain. The adder 56 adds a level adjustment output from the level adjuster 55 to quantized data with an inverted sign supplied from the quantizer 61 to generate an addition output. The adder 56 then supplies this addition output to the fifth integrator 57.

Further, the ΔΣ modulator 13 comprises a quantizer 61. The quantizer 61 quantizes the integral output from the fifth integrator 57 to generate quantized data from an output terminal 62. The quantizer 61 also feeds ΔΣ this data back to the adders 22, 32, 42, 49, and 56.

The following describes the basic operations of the ΔΣ modulator 13. The input terminal 21 is supplied with a multi-bit music signal that is output from the multiplier 12. This music signal is supplied to the adder 22 and is added to a feedback signal supplied from the quantizer 61. This feedback signal is quantized data with an inverted sign. As a result, the quantized data is subtracted from the music data. An output from the adder 22 is supplied to the first integrator 23.

The first integrator 23 has the above-mentioned configuration. The fraction eliminator 25 eliminates a fraction from the data delayed in the delay circuit 26. The feedback loop 24 returns this data to the adder 27. Integration is performed by repeating addition to an adder 22's output supplied to the adder 27. The integral output from the first integrator 23 is supplied to the multiplier 28 and is multiplied by the first order control factor j1 from the order control circuit 14. The order control circuit 14 outputs the first order control factor j1 whose initial value is 1.0.

The music signal is input from the input terminal 21. The multiplier 30 multiplies this music signal by the second order control factor j2 output from the order control circuit 14. The initial value of this second order control factor j2 is 0.0. Accordingly, the multiplier 28 provides no operation. The level adjuster 29 multiplies the output from the first integrator 23 by the appropriate gain. The adder 32 then adds the feedback signal to this output and passes it to the second integrator 33.

The second integrator 33 has the above-mentioned configuration. The fraction eliminator 35 eliminates a fraction from the data delayed in the delay circuit 36. The feedback loop 34 returns this data to the adder 37. Integration is performed by repeating addition to an adder 32's output supplied to the adder 37. The integral output from the second integrator 33 is supplied to the multiplier 38 and is multiplied by the third order control factor j3 from the order control circuit 14. The initial value of this third order control factor j3 is 1.0.

The music signal is input from the input terminal 21. The multiplier 40 multiplies this music signal by the fourth order control factor j4 output from the order control circuit 14. The initial value of this fourth order control factor j4 is 0.0. Accordingly, the second integrator 33 operates like the first integrator 23.

The same processing occurs from the third integrator 43 to the fifth integrator 57. The quantizer 61 quantizes data to 1 bit. This 1-bit data is used as a feedback signal and is reflected on the operation result of the next stage.

Thus, the 5-order ΔΣ modulator 13 shifts a quantized noise to a high frequency and generates a 1-bit output signal out of multi-bit input data.

The following describes how the ΔΣ modulator 13 varies orders. The order control circuit 14 outputs the second order control factor j2 to the multiplier 30. The second order control factor j2 gradually increases from 0.0 and changes to 1.0 within a given time. The first order control factor j1 is expressed as follows:

(first order control factor j1)=1.0−(second order control factor j2)

The first order control factor j1 changes from 1.0 to 0.0 in the same time interval as for the second order control factor j2. When the first order control factor j1 becomes 0.0, this means that a feedback signal set to 0 enters the first integrator 23 and the first stage.

Since the second order control factor j2 is 1.0, this means that a music signal is directly input to the second integrator 33 via the adder 32. According to these operations, the ΔΣ modulator 13 seamlessly shifts from the fifth to the fourth order and finally becomes the complete fourth ΔΣ modulator.

In exactly the same way, it is possible to seamlessly change the ΔΣ modulator 13 to the third order by controlling the third order control factor j2 and the fourth order control factor j4. It is also possible to change from the fifth, the fourth, then to the third order, alternatively, from the fifth to the third order.

The following describes the operations of the 1-bit data editing unit 10 in detail with reference back to FIG. 3. In FIG. 3, like the prior art, a 1-bit data D11 is input to the input terminal 11 as an original sound signal. The multiplier 12 multiplies the input 1-bit data D11 by a factor k (any value) to generate a multi-bit multiplication output with an adjusted sound volume. The ΔΣ modulator 13 receives this output and converts it to 1-bit data to generate the ΔΣ modulation signal D1'.

At this time, the selector 16 is set to the ΔΣ modulation signal D1' side b. When 1-bit data is output, the ΔΣ modulation signal D1' is output. When the factor k becomes 1.0, the multi-bit multiplication output may be assigned a weight 1. In this case, all bits below the weight 1 are reset to 0s. The ΔΣ modulator 13 is not provided with data smaller than or equal to 1 (hereafter referred to as the fraction).

Detecting that the factor k becomes 1.0, the control unit 18 issues an instruction to the order control circuit 14 for lowering the order. By receiving this instruction, the order control circuit 14 controls the first order control factor j1 through the fourth order control factor j4 for lowering the order from the fifth to the fourth or to the third, as mentioned above.

When the ΔΣ modulator 13 finishes shifting to the lower order, the control unit 18 issues an instruction for eliminating the fraction to the fraction eliminator 15. The fraction eliminator 15 comprises the fraction eliminators 25, 35, 45, and 52, each connected to the integrators. The fraction eliminator 15 eliminates a fraction remaining in each integrator by adding or subtracting a slight amount of DC.

When the fraction has been removed, the control unit 18 compares the ΔΣ modulation signal D1' with the delayed original sound signal D11. When the output patterns match within an appropriate range, the control unit 18 switches the selector 16 over to the delayed original sound signal D11 side a.

The ΔΣ modulator 13 switches the ΔΣ modulation signal over to the original sound signal when the order becomes low enough to cause small level differences and phase rotations at the high frequency. The changeover should be available without generating a noise, even if the original sound signal contains a high-frequency signal exceeding the audible band. At this time, the changeover time just takes several tens of milliseconds. A low S/N ratio causes no significant problem while the low order takes effect.

The series of operations described above applies when an output ΔΣ modulation signal is used for volume adjustment or the like, then no adjustment or the like becomes necessary, and finally the output signal is switched to the original sound signal. When the adjustment or the like is needed again, the following operations apply.

While the factor k is 1.0, the ΔΣ modulator 13 keeps operating with the third order unchanged. Specifically, the order control circuit 14 uses the second order control factor j2 set to 1.0, the first order control factor j1 set to 0.0, the fourth order control factor j4 set to 1.0, and the third order control factor j3 set to 0.0.

Just before the factor k changes from 1.0 to a different value, the control unit 18 compares the delayed original sound signal D1*d* with the ΔΣ modulation signal D1'. When the output patterns match within an appropriate range, the control unit 18 switches the selector 16 over to the ΔΣ modulation signal 1' side b. At this time, the ΔΣ modulator 13 is set to the third order. No noise occurs even if the original sound signal contains a high-frequency component. The output is switched over to the ΔΣ modulation signal 1'.

When detecting that the selector 16 is switched, the order control circuit 14 smoothly changes the third order control factor j3 from 0.0 to 1.0. Concurrently, the order control circuit 14 changes the fourth order control factor j4 from 1.0 to 0.0. Since the second order control factor j2 is set to 1.0, the ΔΣ modulator 13 changes to the fourth order.

When this operation is complete, the second order control factor j2 smoothly changes to 0.0. The first order control factor j1 smoothly changes to 1.0. The ΔΣ modulator 13 changes to the fifth order. Consequently, subsequent outputs become fifth ΔΣ modulation outputs, ensuring a sufficient S/N ratio.

As mentioned above, the ΔΣ modulator 13 can smoothly change orders from the fifth to the third. Using this, the 1-bit data editing unit 10 ensures the S/N ratio by maintaining the fifth order when a ΔΣ modulation signal is output for a long period.

When the output is switched to the original sound signal, the 1-bit data editing unit 10 decreases the switching noise due to a level difference and a phase rotation by dropping the order to the third just before the switchover.

Though the above example uses the fifth ΔΣ modulator as a basis, it may be the fourth, sixth, or seventh order. The ΔΣ modulator may be dropped down to the second or the first as needed. In the above-mentioned operation description, the factor k is set to 1.0 or another value. When the factor k is set to 0.0, the order is decreased likewise.

Then, the ΔΣ modulation signal is switched to a fixed-pattern signal representing no sound. If the input/output frequency characteristics satisfy intended conditions, the order control circuit 14 may output the second order control factor j2 and the fourth order control factor j4 always fixed to 1.0.

The integrator is configured as Z-1/(1-Z-1). If the input/output frequency characteristics satisfy intended conditions, the configuration may be 1/(1-Z-1). The multipliers 28 and 38 may be unified. The immediately subsequent level adjusters 29 and 39 also may be unified.

The ΔΣ modulator and input/output signals may comprise not only one bit, but also a plurality of bits.

What is claimed is:

1. A ΔΣ modulator for applying ΔΣ modulation to a multi-bit signal comprising:
   order variation means adapted to vary effective orders increasing due to connection with a plurality of integrators, an effective order of said effective orders being a number of said integrators participating in the modulation of an input to said ΔΣ modulator;
   a first integrator of said plurality of said integrators, said first integrator including first fraction elimination means, a first integrator adder, and a first integrator delay circuit, said first fraction elimination means being adapted to eliminate a fraction remaining in said first integrator, said first integrator adder being adapted to receive an output from said first fraction elimination means, and said first integrator delay circuit being adapted to delay an output from said first integrator adder, said delayed output from said first integrator adder being provided to said first fraction elimination means;
   a first one of a plurality of multipliers adapted to generate a first multiplication output by multiplying said delayed output from said first integrator adder with a first control factor supplied from said order variation means;
   a second one of said plurality of multipliers adapted to generate a second multiplication output by multiplying said input with a second control factor supplied from said order variation means;
   a second integrator of said plurality of said integrators, said second integrator including second fraction elimination means, a second integrator adder, and a second integrator delay circuit, said second fraction elimination means being adapted to eliminate a fraction remaining in said second integrator, said second integrator adder being adapted to receive an output from said second fraction elimination means, and a second integrator delay circuit being adapted to delay an output from said second integrator adder, said delayed output from said second integrator adder being provided to said second fraction elimination means;
   a third one of said plurality of multipliers adapted to generate a third multiplication output by multiplying said delayed output from said second integrator adder with a third control factor supplied from said order variation means; and
   a fourth one of said plurality of multipliers adapted to generate a fourth multiplication output by multiplying said input with a fourth control factor supplied from said order variation means.

2. The ΔΣ modulator according to claim 1, further comprising:
   a first input adder that generates a first addition output by adding said input and quantized data from a quantizer.

3. The ΔΣ modulator according to claim 2, wherein said first integrator adder receives said first addition output.

4. The ΔΣ modulator according to claim 1, further comprising:
   a first level adjuster that multiplies said first multiplication output by a gain to generate a level adjustment; and
   a second input adder that generates a second addition output by adding said second multiplication output, said level adjustment, and quantized data from a quantizer.

5. The ΔΣ modulator according to claim 4, wherein said second integrator receives said second addition output.

6. The ΔΣ modulator according to claim 1, wherein:

(said first control factor)=1.0−(said second control factor).

7. The ΔΣ modulator according to claim 6, wherein said first control factor is "0.0" when said number of said integrators equals the number of said plurality of said integrators.

8. The ΔΣ modulator according to claim 6, wherein said first control factor is "0.1" when said number of said integrators is less than the number of said plurality of said integrators.

* * * * *